United States Patent [19]
Pape et al.

[11] Patent Number: 5,982,028
[45] Date of Patent: *Nov. 9, 1999

[54] SEMICONDUCTOR DEVICE WITH GOOD THERMAL BEHAVIOR

[75] Inventors: Heinz Pape, Aschheim; Frank Hubrich, Pettendorf, both of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/608,491

[22] Filed: Feb. 28, 1996

[30] Foreign Application Priority Data

Feb. 28, 1995 [DE] Germany .............................. 195 06 958

[51] Int. Cl.⁶ .................................................. H01L 23/495
[52] U.S. Cl. ........................................... 257/676; 257/667
[58] Field of Search ...................... 257/667, 676

[56] References Cited

U.S. PATENT DOCUMENTS

| | | | |
|---|---|---|---|
| 5,010,390 | 4/1991 | Tanaka | 257/676 |
| 5,233,222 | 8/1993 | Djennas et al. | 257/676 |
| 5,483,098 | 1/1996 | Joiner, Jr. | 257/676 |

FOREIGN PATENT DOCUMENTS

| | | | |
|---|---|---|---|
| 59-201451 | 11/1984 | Japan | 257/675 |
| 63-224245 | 9/1988 | Japan | 257/676 |
| 3283648 | 12/1991 | Japan | 257/676 |
| 5102389 | 4/1993 | Japan | 257/676 |
| 6-85151 | 3/1994 | Japan | 257/676 |

OTHER PUBLICATIONS

Patent Abstracts of Japan No. 6–85145 A (Akishima), dated Mar. 25, 1994.

*Primary Examiner*—Teresa M. Arroyo
*Attorney, Agent, or Firm*—Herbert L. Lerner; Laurence A. Greenberg

[57] ABSTRACT

One embodiment of a semiconductor device includes a semiconductor chip having long sides. A system carrier is connected to the semiconductor chip and has an island. The island has an opening formed centrally therein over a large area. The opening is wider than the semiconductor chip on two of the long sides of the semiconductor chip. Another embodiment of a semiconductor device includes a semiconductor chip having corner regions. A system carrier is connected to the semiconductor chip and has an island with an opening formed therein. The semiconductor chip is joined to the island only in the corner regions.

11 Claims, 4 Drawing Sheets

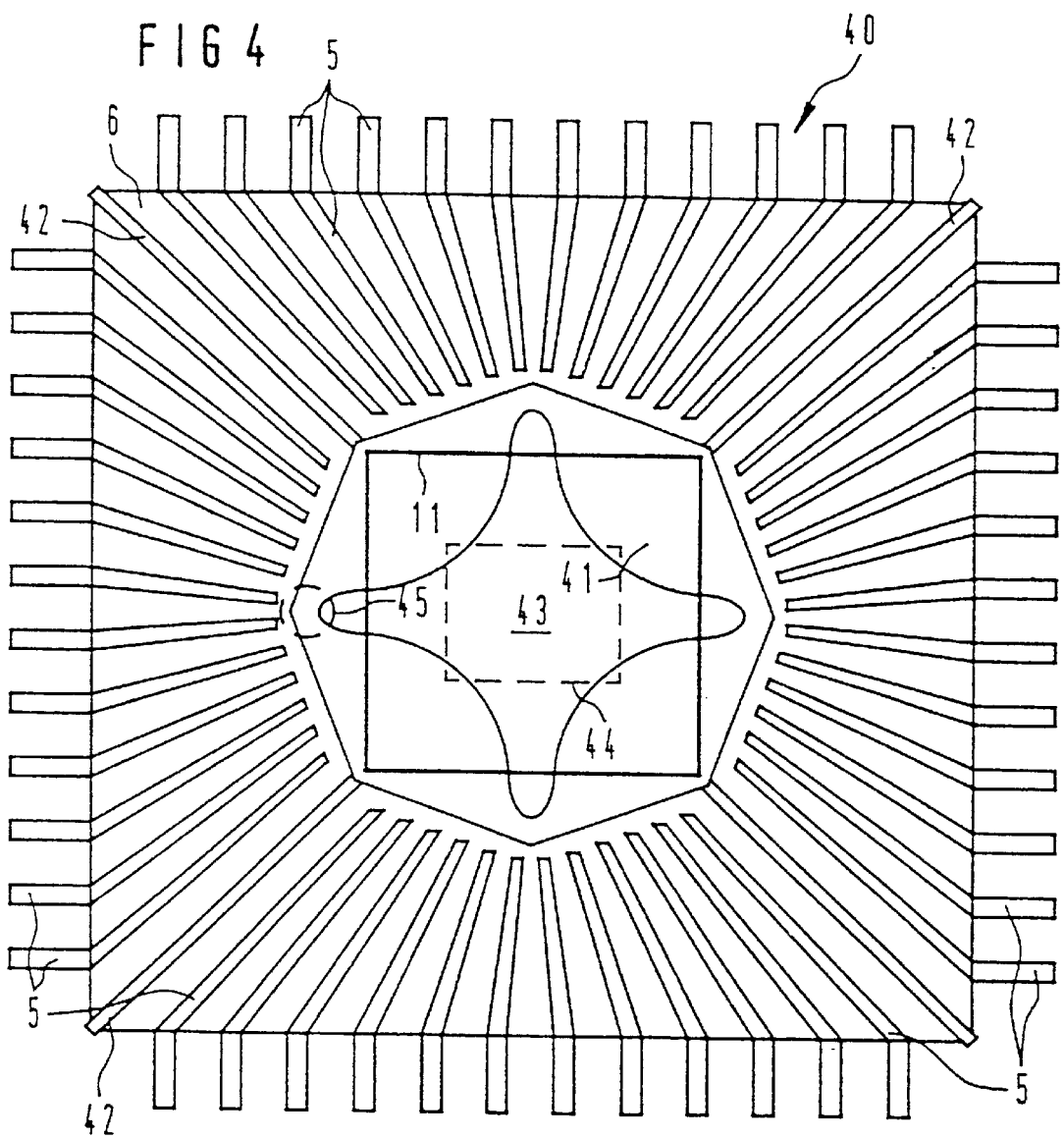
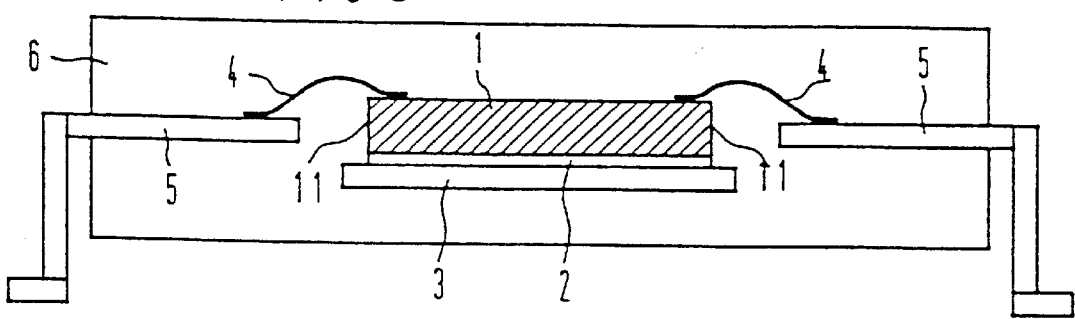

SEMICONDUCTOR DEVICE WITH GOOD THERMAL BEHAVIOR

BACKGROUND OF THE INVENTION

Field of the Invention

The invention relates to a semiconductor device having a semiconductor chip and a system carrier being connected to it and having an island with an opening.

Semiconductor chips are mounted in a package, for the sake of protecting against destruction and against environmental factors, and for the sake of better manipulability. A plastic package is the preferred form for mass-produced products. Initially, the semiconductor chip is joined to a system carrier. The system carrier includes a frame, in which an island-like chip carrier and leads for the finished product are typically provided. Joining of the semiconductor chip to the system carrier, that is to the island that carries the chip, is typically carried out by adhesive bonding or alloying. After the semiconductor chip is mounted, its individual lead tips are connected to the leads of the carrier frame, for example with bonding wires. Subsequently, the semiconductor chip and the leads of the connecting frame are spray-coated in such a way that the semiconductor chip is completely encapsulated, and the leads of the package are electrically and mechanically accessible. Parts of the connection frame (lead frame) which are not needed are then removed by punching. The package is typically made of a hardening plastic molding compound.

Standardized plastic packages are becoming thinner and thinner. The TSOP model (Thin Small Outline Package), which is currently already in use, still has a package thickness of 1 mm. At the same time, the chips built into the packages are becoming larger. With chip dimensions greater than 10×10 MM$^2$, package structures up to 20×20 mm$^2$ are provided (TQFP=Thin Quad Flat Package). In thin plastic packages, the stabilizing effect of the plastic envelope is reduced. Since the connection of the chips to the island and the spray-coating with molding compound are carried out at temperatures of at least 180° C., the coefficients of thermal expansion of the materials involved play a major role, especially in semiconductor devices with large lateral dimensions and extremely thin packages. Ideally, all of the coefficients of expansion should be the same, so that when the device cools down no bimetal effect can occur, and the chip and system carrier island sandwich cannot bend out of shape.

Actually, however, the coefficients of expansion of the primary materials vary greatly. Silicon has a coefficient of thermal expansion of 3, the molding composition of the package has a coefficient of thermal expansion of about 17, and a typical island material such as copper also has a coefficient of thermal expansion of about 17, each being given in units of ppm/K. An allowable extent of bending out of shape of the package is considered to be 30 μm maximum, so that the coplanarity of the leads of the finished component will be assured during further processing, that is soldering.

One possibility for improving the bending performance is to use system carrier islands that are better adapted thermomechanically to silicon, with examples being NiFe alloys such as those known from German Published, Non-Prosecuted Patent Application DE 42 31 705 A1. However, ever-increasing scales of integration and ever-higher chip clock speeds, which cause higher power losses, argue against that. The heat dissipation and therefore heat conductivity of the NiFe alloys is 10 to 20 times worse than those of copper alloys. It is true that when the lead frame material is changed from copper to nickel-iron alloys, the heat resistance of a component does not increase in proportion to the differences between the heat conductivity coefficients. However, even if critical temperatures are not exceeded, higher chip temperatures lower the reliability and shorten the service life of the entire component. In order to provide for heat dissipation from circuits with high power loss, special packages with an inlaid heat distributor (heat slug) or with cooling bodies are then necessary, but are expensive and complicated to manufacture. System carrier islands with slits are known from U.S. Pat. Nos. 4,952,999 and 5,150,193. However, the latter patent also shows a system carrier with a central opening, having diameters which are smaller than the lateral chip dimensions, and having an area which is considerably smaller than the chip area. Both options lead to unacceptable sagging of the package.

SUMMARY OF THE INVENTION

It is accordingly an object of the invention to provide a semiconductor device with good thermal behavior, which overcomes the hereinafore-mentioned disadvantages of the heretofore-known devices of this general type, which has a sandwich made up of a semiconductor chip and a system carrier island and which is improved in terms of both thermomechanical behavior and heat dissipation behavior.

With the foregoing and other objects in view there is provided, in accordance with the invention, a semiconductor device, comprising a semiconductor chip having long sides; and a system carrier being connected to the semiconductor chip and having an island, the island having an opening formed centrally therein over a large area, and the opening being wider than the semiconductor chip on two of the long sides of the semiconductor chip.

In accordance with another feature of the invention, the semiconductor chip has edges associated with the long sides of the semiconductor chip, and the opening is wider than the associated edges of the semiconductor chip on each of the long sides.

In accordance with a further feature of the invention, the semiconductor chip has an edge, and the island is an expansion region in the vicinity of the opening protruding beyond the edge of the semiconductor chip.

In accordance with an added feature of the invention, the semiconductor chip has an edge, and the island is cut open in the vicinity of the opening protruding beyond the edge of the semiconductor chip.

In accordance with an additional feature of the invention, there are provided leads with a given shape, the island having outer edges with a shape being adapted to the given shape.

In accordance with yet another feature of the invention, the central opening in the island is rounded.

In accordance with yet a further feature of the invention, the opening in the island is diamond-shaped, cross-shaped, or star-shaped.

With the objects of the invention in view, there is also provided a semiconductor device, comprising a semiconductor chip having corner regions; and a system carrier being connected to the semiconductor chip and having an island with an opening formed therein; the semiconductor chip being joined to the island only in the corner regions.

In accordance with a concomitant feature of the invention, the island is formed of a material selected from the group consisting of copper and a copper alloy.

The invention is based on the recognition that with large chips, the island has only comparatively slight significance for heat dissipation, but the chip carrier island cannot be miniaturized arbitrarily. Otherwise, unstable conditions would develop when the chip is mounted on the system carrier. Particularly, tilting of the chip can cause a lack of planarity of the chip and the system carrier sandwich. The invention enables secure, plane mounting of the chip on the island with good heat dissipation, even for small chips, in which the system carrier island plays a significant role in heat dissipation, and with only slight sagging of the package in the finished product.

Other features which are considered as characteristic for the invention are set forth in the appended claims.

Although the invention is illustrated and described herein as embodied in a semiconductor device with good thermal behavior, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–4 are diagrammatic, plan views of a system carrier having a region intended for a chip to be mounted; and FIG. 5 is a cross-sectional view of a component used to illustrate the invention.

DESCRIPTION OF THE PREFERRED EMBODIMENTS

Figure 1:
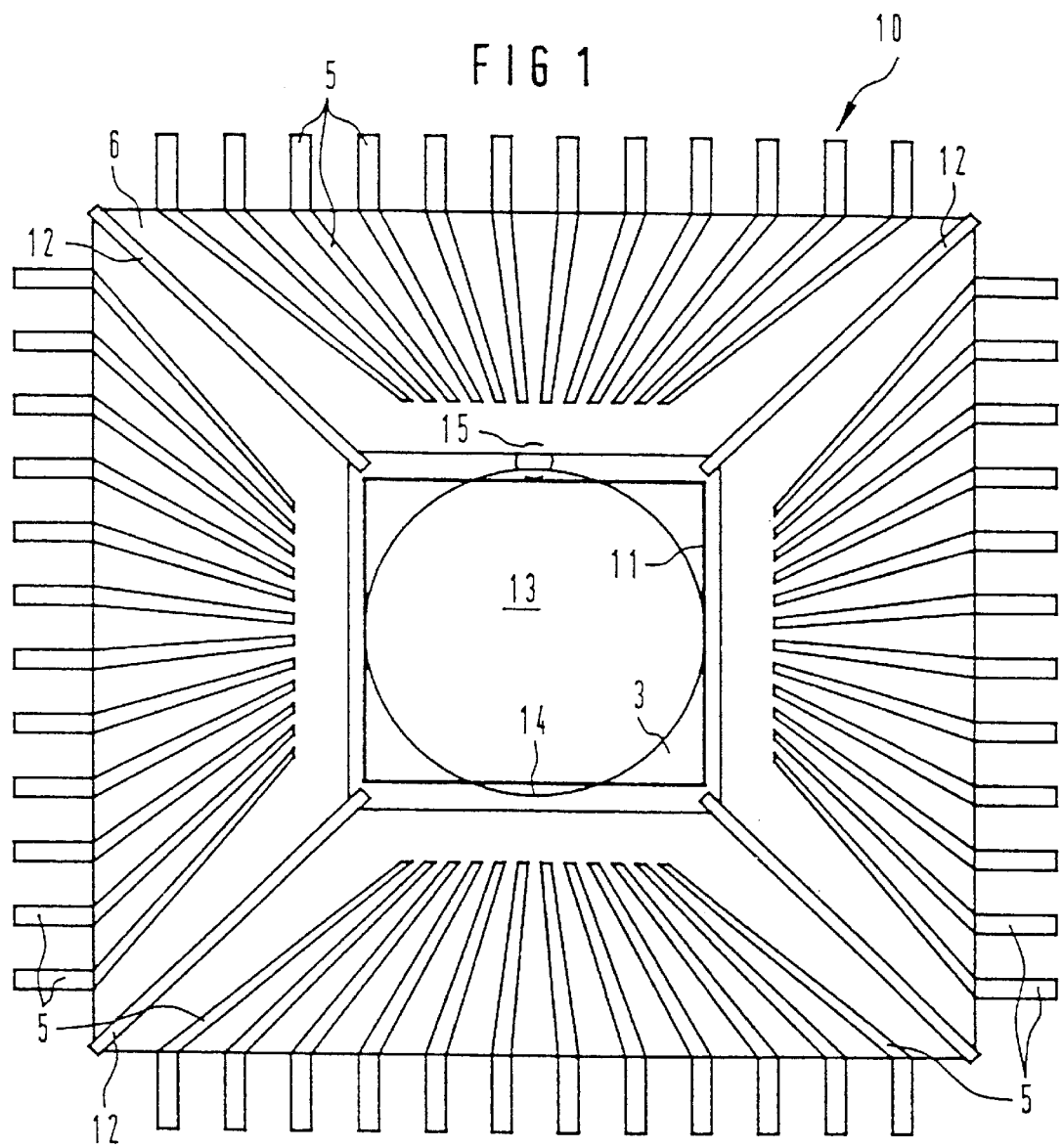

Referring now to the figures of the drawing in detail and first, particularly, to FIG. 5 thereof, there is seen a semiconductor chip 1 which is freely connected at its edges 11 to a system carrier island 3 with the aid of a connection 2, for instance an adhesive substance. The chip 1 is joined electrically to leads 5 with the aid of bonding wires 4, and after spray-coating of the configuration with a molding compound 6, these leads are freely accessible for further processing of the device.

FIG. 1 shows a diagrammatic plan view of a section of a configuration 10, approximately at the level of the chip carrier island 3 in FIG. 5. The edges 11 of the chip 1 and the leads 5 are also shown in FIG. 1. The chip carrier island 3 is secured to narrow diagonal carriers 12, with which the chip carrier island was secured to a lead frame before those parts of the lead frame that are no longer needed were stamped out. The chip carrier island 3 has a large-area central opening 13, which protrudes beyond the edge of the chip on two sides of the chip. Since the opening is approximately circular and the chip is rectangular in the exemplary embodiment, the diameter of the opening is greater than the shorter side of the semiconductor chip. FIG. 1 shows an opening with a diameter that is approximately equivalent to the length of the long side of the chip. However, it is also possible to select a diameter somewhat smaller or somewhat greater than the long side of the chip. In the latter case, the opening would be wider than the chip on all sides of the chip. In the exemplary embodiment, a web region 15 of the system carrier island 3, which is outlined in dashed lines, continues to have no contact with the chip.

Figure 2:
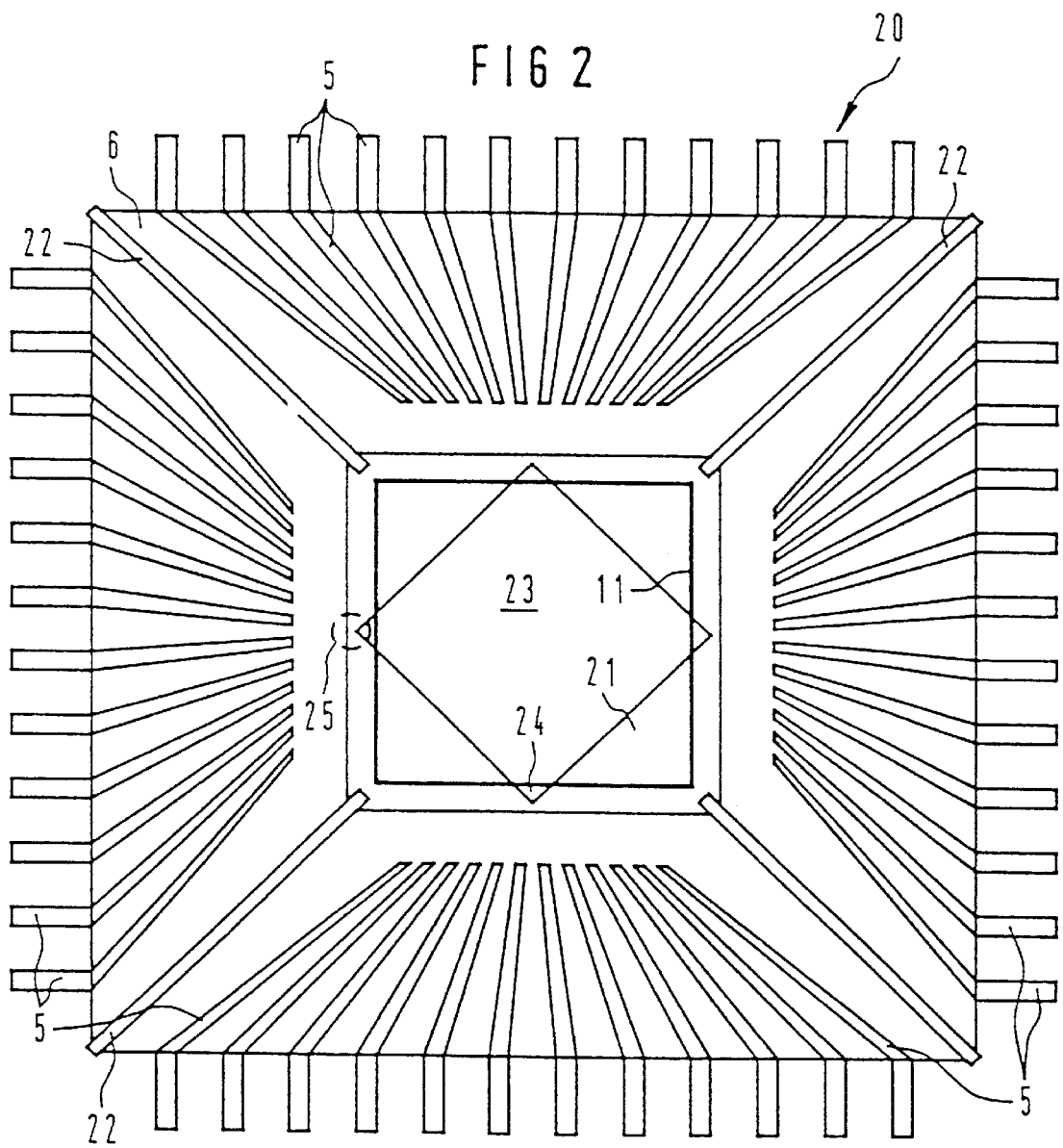

In a configuration 20 of FIG. 2, a chip carrier island 21 is secured to outer strips 22 and has a rectangular opening 23, which is rotated relative to the semiconductor chip that has the edge 11, in such a way that corners 24 of the opening protrude beyond the long sides of the chip. In that case, the opening on all of the long sides of the semiconductor chip is wider than the semiconductor chip. What remains is weblike regions 25, which are not covered by the chip on the long sides of the semiconductor chip.

Figure 3:
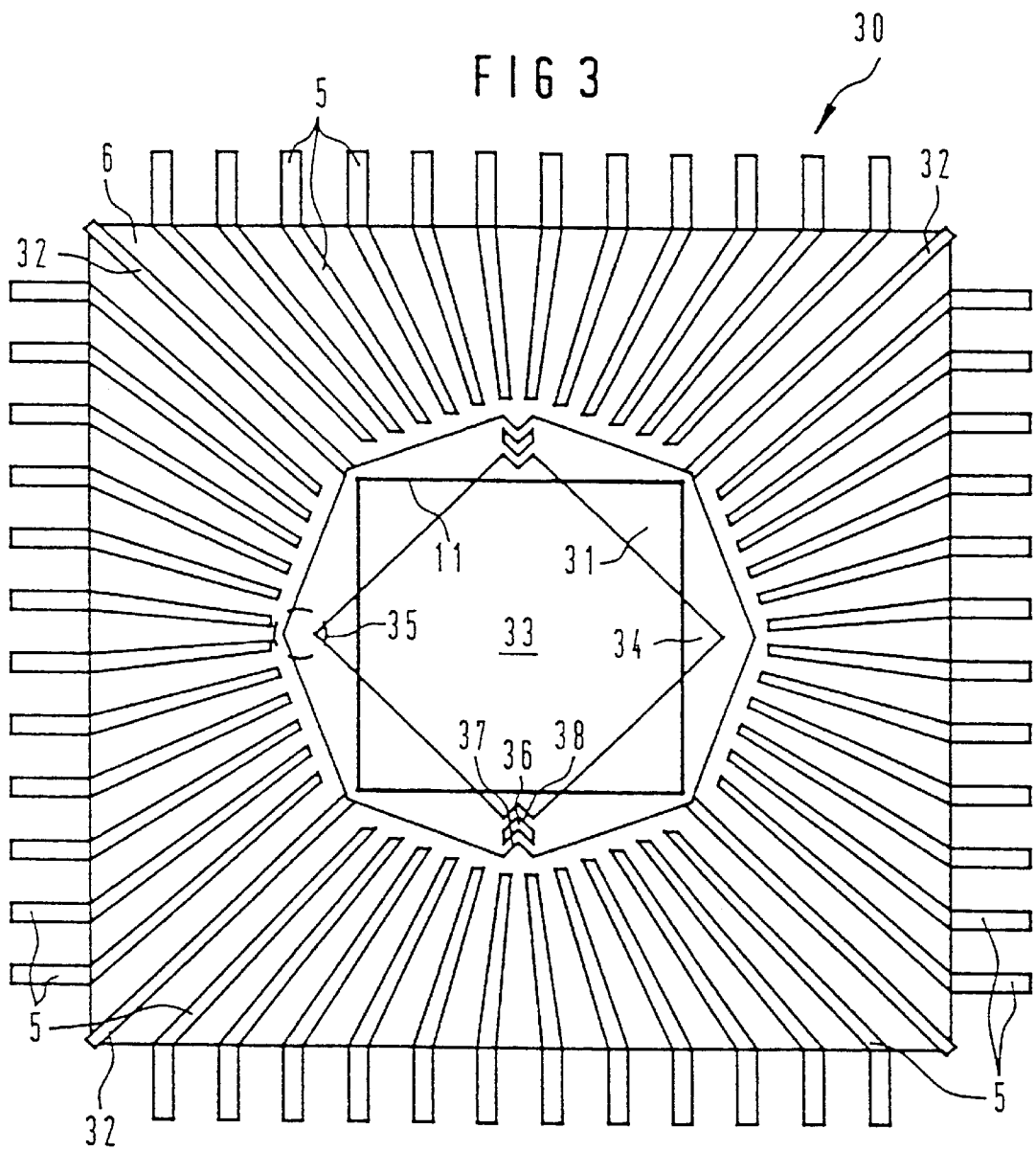

In a configuration 30 of FIG. 3, an outer boundary of a chip carrier island 31 is octagonal. Conversely, an opening 33 is approximately rectangular and is rotated relative to the chip, somewhat as in FIG. 2; in such a way that corners 34 of the opening are located on the long sides of the edge 11 of the chip. In this case as well, weblike regions 35 that do not touch the semiconductor chip remain along the long sides of the semiconductor chip. Additional openings 36 are provided on two long sides of the chip in the remaining web region of the system carrier 31 in FIG. 3. The additional openings 36 are defined by two narrow webs 37 and 38 and by two further regions of the system carrier. The webs 37 and 38 are bent at an angle toward the semiconductor chip in the exemplary embodiment, so that elements 36–38 form an expansion region for the chip carrier island, when the chip expands crosswise to the two opposed expansion regions.

FIG. 4 shows a further configuration 40, in which an opening 43 of a system carrier island 41 is constructed in the form of a cross, with tips of the opening pointing in the direction of the long sides of the semiconductor chip. This embodiment is also especially suitable for use with small chips that have an approximate minimum size which is represented by a dashed line 44. The configuration has an advantage over the exemplary embodiments of FIGS. 1–3 which is that even smaller chip sizes can be used. In a device according to the invention, it is possible to use merely a single system carrier or system carrier island for many different chip sizes.

A copper alloy is preferably used as the material for the lead frame or for the system carrier island. The system carrier island is constructed in such a way that as a result of the opening, as little island material as possible remains below the mounted chip. The opening can be punched out or etched. The device according to the invention is distinguished by the fact that the semiconductor chip no longer rests with its entire surface on, or is joined by its entire surface to, the system carrier. Instead, it now rests on or is joined to the system carrier only in the region of its corners and possibly in the narrowest possible peripheral region. As a result, expansion regions can be provided outside the chip region in the system carrier island, so that their expansion has no effect on the chip expansion.

In principle, the web regions located outside the boundary of the chip can also be omitted entirely, so that the four regions of connection of the system carrier island to the chip are completely separate from one another at the corners of the chip. The prerequisite for this is adequate mechanical stability of the parts of the island. This stability exists especially if leads remain joined directly to the parts of the island and therefore provide not only suspension for the island but also stabilization of the island regions. It is possible in that case for the corner regions of the system carrier island to be cut open even before die bonding is carried out.

The expansion regions 36–38 shown in FIG. 3 may be constructed in such a way that they break and act as a rated breaking point in response to a weak thermomechanical strain, so that individual regions, and especially the four corner regions of the system carrier island, are separated completely from one another. The embodiment shown in FIGS. 3 and 4, with an octagonal basic shape of the system carrier island, has the particular advantage that it follows the typically obliquely recessed leads 5 at minimal spacing, and the poorly heat-conducting plastic molding compound zone 6 between the island boundary and the lead tips is kept as thin as possible.

The device according to the invention has the further advantage of reducing thermomechanical tensile forces exerted on the chip by the island in a cooling down process, and shortening or even disrupting long, straight action lines of the tensile forces. The device according to the invention prevents a continuous buildup of force, particularly along the long chip diagonals and as much as possible along the chip edges as well. It is self-evident that the invention is not limited to the embodiments shown in the exemplary embodiments, and particularly not to PQFP forms, but instead can be adopted to other plastic models as well.

The decisive advantage of the invention over previously known configurations is that a copper alloy can be used as the system carrier material instead of a nickel-iron alloy. As a result, without increasing thermomechanical bending of the semiconductor device, and in fact even reducing such bending, considerably improved heat dissipation can be achieved without having to place a heat slug or heat conducting plate in the package or having to mount a cooling body on the package. Finally, the invention has the advantage of permitting the chip to be secured stably on the system carrier, and at the same time permitting one system carrier to be used for a plurality of different chip sizes.

We claim:

1. A semiconductor device, comprising:
a semiconductor chip having long sides;
a plastic molding compound surrounding said semiconductor chip;
a system carrier being connected to said semiconductor chip and having an island with outer edges, said island having a through opening formed centrally therein, said through opening covering an area enclosed by said outer edges of said island, and the area being wider than said semiconductor chip on two of said long sides of said semiconductor chip for allowing a direct physical contact between said semiconductor chip and said plastic molding compound; and
leads having a given shape and ends, said outer edges of said island having a given shape adapted to said given shape of said leads such that distances between said outer edges and said ends of said leads are substantially constant around a perimeter of said island.

2. The device according to claim 1, wherein said semiconductor chip has edges associated with said long sides of said semiconductor chip, and said through opening is wider than said associated edges of said semiconductor chip on each of said long sides.

3. The device according to claim 1, wherein said semiconductor chip has an edge, and said island is an expansion region in the vicinity of said through opening protruding beyond said edge of said semiconductor chip.

4. The device according to claim 1, wherein said semiconductor chip has an edge, and s aid island is cut open in the vicinity of said through opening protruding beyond said edge of said semiconductor chip.

5. The device according to claim 1, wherein said central through opening in said island is rounded.

6. The device according to claim 1, wherein said through opening in said island is diamond-shaped.

7. The device according to claim 1, wherein said central through opening in said island is cross-shaped.

8. The device according to claim 1, wherein said central through opening in said island is star-shaped.

9. The device according to claim 1, wherein said island is formed of a material selected from the group consisting of copper and a copper alloy.

10. The device according to claim 1, wherein said island is octagon-shaped.

11. A semiconductor device, comprising:
a semiconductor chip having long sides;
a plastic molding compound surrounding said semiconductor chip; and
a system carrier being connected to said semiconductor chip and having an island with outer edges, said island having a through opening formed centrally therein, and said through opening covering an area enclosed by said outer edges of said island, the area being wider than said semiconductor chip on two of said long sides of said semiconductor chip for allowing a direct physical contact between said semiconductor chip and said plastic molding compound.

* * * * *